United States Patent
Lee et al.

(10) Patent No.: US 11,211,231 B2
(45) Date of Patent: Dec. 28, 2021

(54) PLASMA GENERATION APPARATUS

(71) Applicant: Korea Research Institute of Standards and Science, Daejeon (KR)

(72) Inventors: Hyo Chang Lee, Sejong-si (KR); Jung-Hyung Kim, Daejeon (KR); Dae-Jin Seong, Gongju-si (KR)

(73) Assignee: Korea Research Institute of Standards and Science, Daejeon (KR)

( * ) Notice: Subject to any disclaimer, the term of this patent is extended or adjusted under 35 U.S.C. 154(b) by 174 days.

(21) Appl. No.: 16/461,687

(22) PCT Filed: Jan. 2, 2018

(86) PCT No.: PCT/KR2018/000008
§ 371 (c)(1),
(2) Date: May 16, 2019

(87) PCT Pub. No.: WO2018/128339
PCT Pub. Date: Jul. 12, 2018

(65) Prior Publication Data
US 2019/0355558 A1 Nov. 21, 2019

(30) Foreign Application Priority Data
Jan. 3, 2017 (KR) .................. 10-2017-0000559

(51) Int. Cl.
*H01J 37/32* (2006.01)
*H05H 1/24* (2006.01)
*H05H 1/46* (2006.01)

(52) U.S. Cl.
CPC .. *H01J 37/32816* (2013.01); *H01J 37/32165* (2013.01); *H01J 37/32458* (2013.01);
(Continued)

(58) Field of Classification Search
None
See application file for complete search history.

(56) References Cited

U.S. PATENT DOCUMENTS 7,112,792 B2 9/2006 Agemura et al.
7,780,793 B2 8/2010 Yang et al.
(Continued)

FOREIGN PATENT DOCUMENTS

CN 101903984 A 12/2010
CN 105428194 A 3/2016
(Continued)

OTHER PUBLICATIONS

International Search Report dated Apr. 27, 2018; International Application No. PCT/KR2018/000008; International Filing Date Jan. 2, 2018; 8 pages; International Searching Authority/KR; Daejeon, Republic of Korea.
Oleg V. Polomarov, et al.; "Enhanced Collisionless Heating in a Nonuniform Plasma at the Bounce Resonance Condition"; 7 pages; Physics of Plasmas 12; 2005; vol. 12, No. 8.
(Continued)

*Primary Examiner* — Amy Cohen Johnson
*Assistant Examiner* — Srinivas Sathiraju
(74) *Attorney, Agent, or Firm* — Andrew D. Fortney; Central California IP Group, P.C.

(57) ABSTRACT

A plasma generation apparatus includes a plasma generation unit. The plasma generation unit has a spherical or elliptical cavity. The plasma generation unit receives radio-frequency (RF) power in such a manner that bounce resonance of electrons is performed to generate plasma in the cavity. The cavity has a plasma extraction hole to communicate with an external space.

15 Claims, 8 Drawing Sheets

(52) U.S. Cl.
CPC ............ *H05H 1/24* (2013.01); *H01J 37/3244* (2013.01); *H01J 37/32715* (2013.01); *H05H 1/4645* (2021.05)

(56) References Cited

U.S. PATENT DOCUMENTS

| | | | | |
|---|---|---|---|---|
| 8,846,163 | B2* | 9/2014 | Kao | H01J 37/32082 |
| | | | | 427/545 |
| 9,711,333 | B2* | 7/2017 | Sieber | H01J 37/32082 |
| 9,793,096 | B2 | 10/2017 | Kang et al. | |
| 10,665,429 | B2 | 5/2020 | Kang et al. | |
| 2003/0070914 | A1* | 4/2003 | Hong | H01J 37/3402 |
| | | | | 204/192.2 |
| 2004/0071267 | A1* | 4/2004 | Jacob | H05G 2/006 |
| | | | | 378/119 |
| 2005/0205110 | A1* | 9/2005 | Kao | H01L 21/02104 |
| | | | | 134/1.1 |
| 2008/0160210 | A1 | 7/2008 | Yang et al. | |
| 2012/0244704 | A1* | 9/2012 | Kao | H01L 21/67069 |
| | | | | 438/683 |
| 2012/0267346 | A1* | 10/2012 | Kao | C23C 14/022 |
| | | | | 219/121.52 |
| 2014/0076234 | A1* | 3/2014 | Kao | C23C 14/022 |
| | | | | 118/719 |
| 2014/0148014 | A1* | 5/2014 | You | H01J 37/32568 |
| | | | | 438/712 |
| 2014/0299272 | A1 | 10/2014 | Tsuji et al. | |
| 2015/0228456 | A1* | 8/2015 | Ye | H01J 37/32522 |
| | | | | 315/111.51 |
| 2016/0029472 | A1* | 1/2016 | Jevtic | H01J 37/3244 |
| | | | | 250/288 |
| 2016/0079036 | A1* | 3/2016 | Kang | C23C 16/509 |
| | | | | 156/345.34 |
| 2016/0329191 | A1* | 11/2016 | Sieber | H01J 37/32082 |
| 2016/0329192 | A1* | 11/2016 | Sieber | H05H 1/2475 |
| 2016/0329193 | A1* | 11/2016 | Sieber | H01J 37/32449 |
| 2017/0027051 | A1* | 1/2017 | Jevtic | H05H 1/46 |
| 2017/0372870 | A1* | 12/2017 | Godyak | H01J 37/3211 |
| 2018/0068833 | A1* | 3/2018 | Kang | C23C 16/345 |
| 2018/0087165 | A1* | 3/2018 | Alcaraz | C25B 9/00 |
| 2018/0138022 | A1* | 5/2018 | Lam | H01J 37/321 |
| 2020/0335304 | A1 | 10/2020 | Kang et al. | |

FOREIGN PATENT DOCUMENTS

| | | |
|---|---|---|
| JP | 1154296 A | 2/1999 |
| JP | 2016-063221 A | 4/2016 |
| KR | 10-0716263 B1 | 5/2007 |
| KR | 10-2008-0110967 A | 12/2008 |
| KR | 10-2011-0118206 A | 10/2011 |

OTHER PUBLICATIONS

Office Action dated Dec. 14, 2020; Chinese Pat. Appl. No. 201880004923.0; China National Intellectual Property Administration (CNIPA); 8 pgs.

* cited by examiner

PLASMA GENERATION APPARATUS

CROSS-REFERENCE TO RELATED APPLICATIONS

This application is a continuation of and claims priority to PCT/KR2018/000008 filed on Jan. 2, 2018, which claims priority to Korea Patent Application No. 10-2017-0000559 filed on Jan. 3, 2017, the entireties of which are both hereby incorporated by reference.

TECHNICAL FIELD

The present disclosure relates to a plasma generation apparatus and, more particularly, to a plasma generation apparatus, having a spherical cavity, in which electrons perform bounce resonance to the cavity.

BACKGROUND

A critical dimension of a semiconductor process using plasma has been reduced. With capacitively coupled plasma (CCP) or inductively coupled plasma (ICP) widely used at present, it is difficult to perform a semiconductor process having a reduced critical dimension.

First, when capacitively coupled plasma or inductively coupled plasma is used, it is difficult to perform an atomic-level fine process because a process should be performed under a high electron density.

Second, damage is caused by collision and charging of high-energy ions.

In order to address the above issues, a novel plasma processing technique, having significantly lower pressure (several milliTorr (mTorr) or less) than a pressure in a conventional process, is required.

Hollow cathode discharging is disclosed in Korean Patent Application No. 10-2013-0142585 A. However, such an apparatus operates at high pressure of several tens of milliTorr or more and requires a plasma source operating at lower pressure.

A low pressure plasma source is disclosed in Korean Patent Registration No. 10-1352496 B1. However, it is difficult for such an apparatus to perform large-area processing.

SUMMARY

An aspect of the present disclosure is to provide an apparatus for generating plasma at low pressure of several milliTorr (mTorr) or less (more specifically, 1 mTorr or less).

According to an aspect of the present disclosure, a plasma generation apparatus includes a plasma generation unit. The plasma generation unit has a spherical or elliptical cavity. The plasma generation unit receives radio-frequency (RF) power in such a manner that bounce resonance of electrons is performed to generate plasma in the cavity. The cavity has a plasma extraction hole to communicate with an external space.

In example embodiments, the plasma generation apparatus may further include a parasitic discharge prevention unit disposed to cover the plasma generation unit to prevent generation of parasitic plasma, having an auxiliary hole aligned with the plasma extraction hole, and formed of an insulating material, and an RF power supply configured to supply the RF power, having a driving frequency corresponding to a bounce resonance frequency given by temperature of electrons and a diameter of the cavity, to the plasma generation unit.

In example embodiments, the RF power supply may be a variable frequency power supply or a power supply having a plurality of driving frequencies.

In example embodiments, the plasma generation unit includes a left plasma generation unit, having a left hemispherical cavity having the plasma extraction hole, and a right plasma generation unit having a right hemispherical cavity aligned with the left hemispherical cavity. The parasitic discharge prevention unit may have a cylindrical shape, the parasitic discharge prevention unit may have one end provided with an auxiliary hole formed in a center thereof, and the parasitic discharge prevent unit may have the other end opened. The plasma generation apparatus may further include a cylindrical auxiliary insulating portion having one end disposed in contact with the other end of the plasma generation unit.

In example embodiments, the plasma generation unit may be disposed inside a vacuum chamber, may have a plurality of spherical or elliptical cavities and plasma extraction holes, may be formed to respectively communicate an internal space of the vacuum chamber with the cavities, and may receive the RF power to generate plasma in the cavities.

In example embodiments, the plasma generation unit may include gas supply holes, respectively formed in positions facing the plasma extraction holes from the cavities, and a gas distribution space communicating with the gas supply holes.

In example embodiments, the plasma extraction holes may be spaced apart from each other and are periodically arranged at regular intervals in an azimuthal direction and a central axis direction.

In example embodiments, the plasma generation apparatus may further include a cylindrical process chamber connected to an opened end of the process chamber, a substrate holder configured to receive radicals generated by the plasma generation unit in the process chamber, and a substrate disposed on the substrate holder to receive the radicals. The substrate holder may have a disc shape.

According to an aspect of the present disclosure, a plasma generation apparatus includes a plasma generation unit having a spherical or elliptical cavity and a plasma extraction hole, formed to communicate an external space with the cavity, receiving radio-frequency (RF) power to generate plasma in the cavity, and formed of a conductive material, a parasitic discharge prevention unit disposed to cover the plasma generation unit to prevent generation of parasitic plasma, having an auxiliary hole aligned with the plasma extraction hole, and formed of an insulating material, and an RF power supply configured to supply RF power having a driving frequency, corresponding to a bounce resonance frequency given by temperature of electrons in the cavity and a diameter of the cavity, to the plasma generation unit.

In example embodiments, the RF power supply may be a variable frequency power supply.

In example embodiments, the plasma generation unit may be in the form of a cylinder having one end provided with the plasma extraction hole, the plasma generation unit may include a left plasma generation unit, having a left hemispherical cavity having the plasma extraction hole, and a right plasma generation unit having a right hemispherical cavity aligned with the left hemispherical cavity. The parasitic discharge prevention unit may have a cylindrical shape, the parasitic discharge prevention unit may have one end provided with an auxiliary hole formed in a center thereof, and the parasitic discharge prevention unit may have the other end opened. The plasma generation apparatus may further include a cylindrical auxiliary insulating portion having one end disposed in contact with the other end of the plasma generation unit, a power supply rod, disposed to penetrate through a center of the auxiliary insulating portion, being in electrical contact with the other end of the plasma generation unit, a cylindrical guide pipe having one end coupled to the other end of the auxiliary insulating portion, formed of a conductive material, and extending in an extension direction of the auxiliary insulating portion, a coaxial cable, disposed in the guide pipe, supplying power to the power supply rod, a flange inserted into the other end of the guide pipe, disposed to cover the other end of the guide pipe, and coupled to a port of a vacuum chamber, and a power cable connection portion, coupled to the other end of the guide pipe, including an electrical connector supplying power to the coaxial cable.

In example embodiments, the plasma generation unit may include an upper plasma generation unit, having the plasma extraction hole and an upper hemispherical cavity, and a lower plasma generation unit having a gas supply hole, formed in a position facing the plasma extraction hole, and a lower hemispherical cavity aligned with the upper hemispherical cavity. The parasitic discharge prevention unit may have an auxiliary hole and is formed to fully cover the plasma generation unit, the parasitic discharge prevention unit and the plasma generation unit may be disposed inside a vacuum chamber, a gas may be supplied to the gas supply hole through a vacuum port mounted at the vacuum chamber, and the lower plasma generation unit may receive RF power through the vacuum port mounted at the vacuum chamber.

According to an aspect of the present disclosure, a plasma processing apparatus include a vacuum chamber, a plasma generation unit disposed inside the vacuum chamber, having a plurality of spherical or elliptical cavities and plasma extraction holes, formed to respectively communicate an internal space of the vacuum chamber with the plurality of cavities, receiving RF power to generate plasma in the cavities, and formed of a conductive material, a parasitic discharge prevention unit disposed to cover the plasma generation unit to prevent generation of parasitic plasma, having auxiliary holes respectively aligned with the plasma extraction holes, and formed of an insulating material, and a radio-frequency (RF) power supply configured to supply RF power, having a driving frequency corresponding to a bounce resonance frequency given by temperature of electrons in the cavity and a diameter of the cavity, to the plasma generation unit.

In example embodiments, the plasma generation unit may include gas supply holes, respectively formed in positions facing the plasma extraction holes from the cavities, and a gas distribution space communicating with the gas supply holes.

In example embodiments, the vacuum chamber may have a cylindrical shape, and the plasma generation unit may have a disc shape and is disposed on an internal upper portion of the vacuum chamber. The plasma processing apparatus may further include a substrate holder, disposed to face the plasma extraction holes of the plasma generation unit in the vacuum chamber, and a substrate disposed on the substrate holder to receive plasma extracted by the plasma extraction holes. The substrate holder may have a disc shape.

In example embodiments, the vacuum chamber may have a rectangular box shape, and the plasma generation unit may have a rectangular plate shape and is disposed on an internal upper portion of the vacuum chamber. The plasma processing apparatus may further include a substrate holder, disposed to face the plasma extraction holes of the plasma generation unit in the vacuum chamber, and a substrate disposed on the substrate holder to receive plasma extracted by the plasma extraction holes. The substrate holder may have a rectangular pillar shape.

In example embodiments, the vacuum chamber may have a cylindrical shape, the plasma generation unit may have a cylindrical shape and is disposed on an internal side surface of the vacuum chamber, the gas distribution space may be in the form of a cylinder embedded in the plasma generation unit, the plasma extraction holes of the plasma generation unit may be arranged to face a central axis of the plasma generation unit, and the plasma extraction holes may be spaced apart from each other and are periodically arranged at regular intervals in an azimuthal direction and a central axis direction.

In example embodiments, the plasma processing apparatus may further include a cylindrical process chamber, connected to an opened end of the vacuum chamber, a substrate holder, disposed to receive radicals generated by the plasma generation unit in the process chamber, and a substrate disposed on the substrate holder to receive the radicals. The substrate holder may have a disc shape.

BRIEF DESCRIPTION OF THE DRAWINGS

The present disclosure will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the present disclosure.

DETAILED DESCRIPTION

Figure 1:
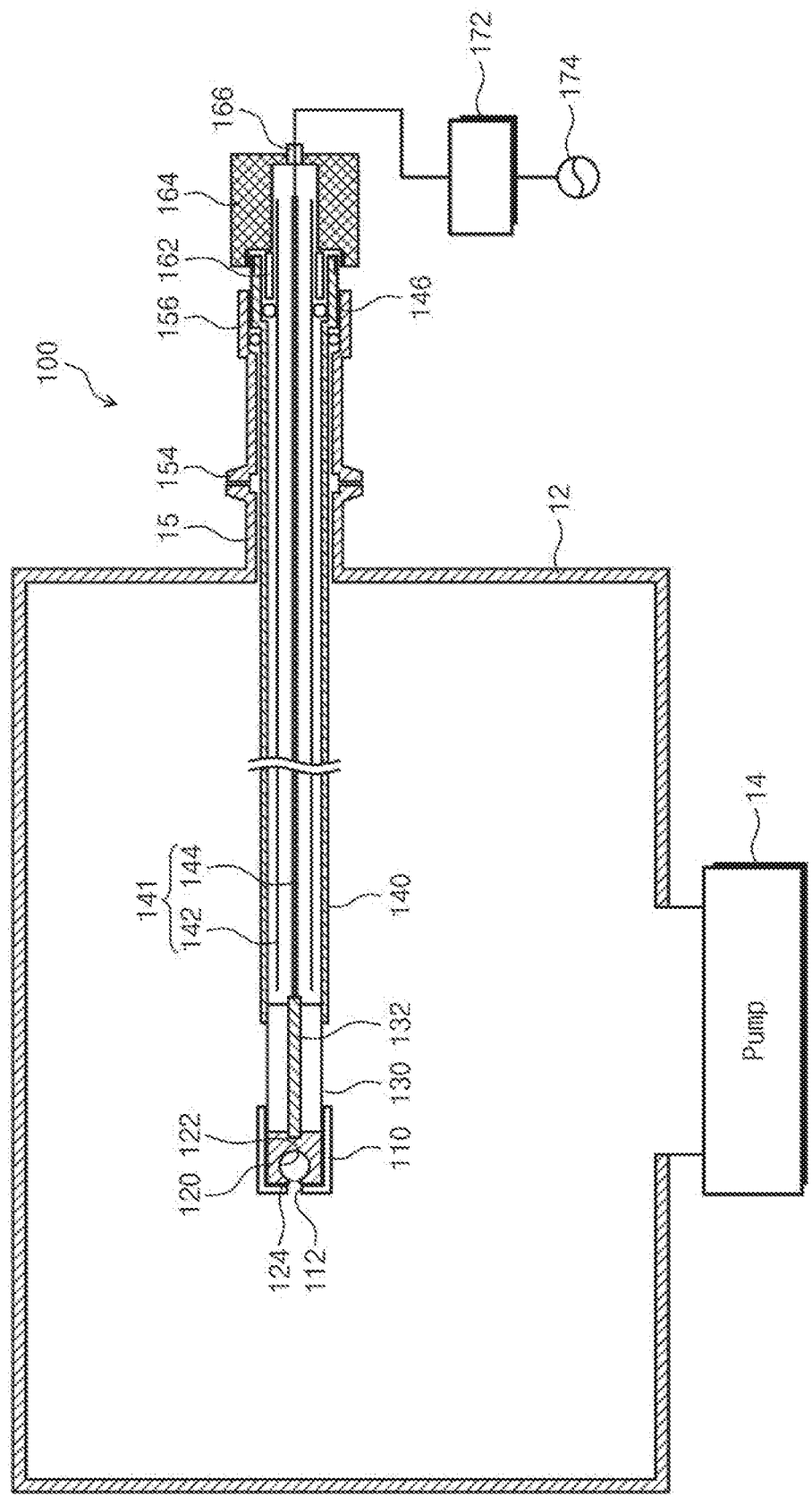
FIG. 1 illustrates a plasma system according to an example embodiment of the present disclosure.

A plasma generation apparatus according to an example embodiment may change a spherical cavity enabling plasma to be generated at a low pressure, a size of a hole connected to the cavity, and plasma characteristics depending on a change in external power. Accordingly, the plasma generation apparatus may be applied to a UV (or EUV) source, a plasma thruster, an apparatus for measuring plasma spectroscopy of a gas, an industrial plasma source such as a semiconductor, and the like.

The plasma generating apparatus according to an example embodiment uses bounce resonance of plasma.

A plasma generation apparatus according to an example embodiment uses bounce resonance of plasma.

$$n\Omega_b = \omega/2\pi \Omega_b = v_{th}/L \qquad \text{Equation (1):}$$

where n denotes a positive integer greater than or equal to 1, ω denotes an angular frequency of RF power, L denotes a diameter of the cavity, and $v_{th}$ denotes average speed of electrons. Accordingly, when a diameter of a cavity, temperature and average speed of electrons, and electron energy are given, a driving frequency may be set to satisfy Equation (1). For example, when temperature of electrons is about 10 eV and a cavity has a diameter of about 4 centimeters (cm), a driving frequency may be 13.56 megahertz (MHz).

A conventional plasma generation source is a structure in which it is difficult for electrons to continuously perform bounce resonance. This is because when electrons are accelerated to some extent, they may disappear to a chamber wall beyond a potential of an opposite wall or cannot continuously bounce due to a limitation in chamber size.

A plasma generation apparatus according to an example embodiment has a spherical or elliptical plasma generation space in such a manner that electrons may continuously perform bounce. Accordingly, the electrons are continuously accelerated. As a result, the present disclosure is different from conventional hollow cathode discharge in terms of structure, plasma generation principle, and operating region. More specifically, the hollow cathode discharge forms an electrode with a trench structure and applies power the electrode to maintain a high sheath voltage. Electrons, present in a sheath space, are accelerated by an applied electric field, and the accelerated electrons collide with neutral species to generate plasma. Accordingly, the hollow cathode discharge operates at high pressures of tens or hundreds of milliTorr or more. However, in the present disclosure, since electrons obtain energy using electron bounce, plasma is generated based on the principle that electrons obtain energy by matching a frequency of applied power with a bounce resonance frequency of the electrons. Therefore, the plasma may be generated even at a low pressure or a significantly low pressure. In detail, a cavity structure may have a spherical or ellipsoidal shape in such a manner that electron bounce occurs well. Electron energy, corresponding to a resonance condition, may be adjusted by varying a driving frequency or a size of the cavity corresponding to the bounce resonance frequency. Thus, plasma parameters such as plasma density, temperature, and uniformity, and the like may be controlled.

A plasma generation apparatus according to an example embodiment may be mounted in a port of a chamber. The plasma generation apparatus includes a plasma generation unit having a spherical cavity. For example, the cavity may have a diameter of about 6.5 cm. The plasma generation unit may have a hole of 9 millimeters (mm) communicating with the cavity to discharge plasma, generated in the cavity, outwardly of the cavity. As a result, stable plasma may be generated at a significantly low pressure (1 milliTorr or less). Plasma density is at the level of $10^{10}/cm^3$, which is significantly high. The plasma generation apparatus may generate ultraviolet (UV) or extreme ultraviolet (EUV) depending on a gas used.

Embodiments of the present disclosure will now be described below more fully with reference to accompanying drawings. The present disclosure may, however, be embodied in different forms and should not be constructed as limited to the embodiments set forth herein. Rather, these embodiments are provided so that this disclosure will be thorough and complete, and will fully convey the scope of the present invention to those skilled in the art.

FIG. 1 illustrates a plasma system according to an example embodiment of the present disclosure.

Figure 2:
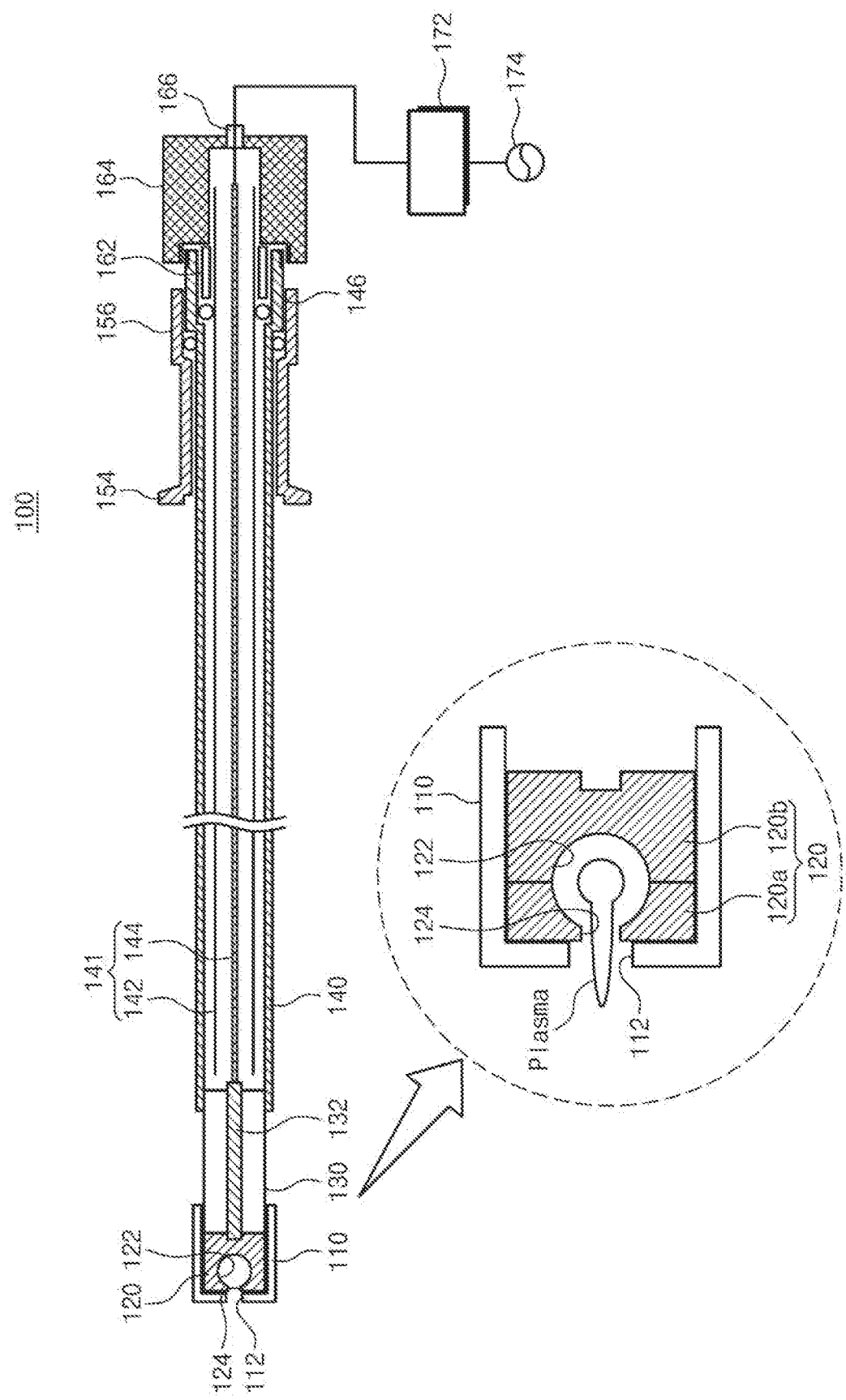
FIG. 2 is a conceptual diagram of a chamber-insertion plasma generation apparatus mounted in the plasma system in FIG. 1.

FIG. 2 is a conceptual diagram of a chamber-insertion plasma generation apparatus mounted in the plasma system in FIG. 1.

Referring to FIGS. 1 and 2, a plasma system 10 may include a vacuum chamber 12, a vacuum pump 14, and a plasma generation apparatus 100. The plasma generation apparatus 100 may include a plasma generation unit 120, a parasitic discharge prevention unit 110, and radio-frequency (RF) power supply 174. The vacuum chamber 14 may be used for various purposes such as deposition, etching, surface treatment, sample analysis, and the like.

The plasma generation apparatus 100 may be inserted into the vacuum chamber 12 through a port 15 to perform plasma discharge. Accordingly, the plasma generation apparatus 100 may generate ultraviolet (UV) or extreme ultraviolet (EUV) depending on a gas used. The plasma generation apparatus 100 may be inserted into various apparatuses, maintained in a vacuum state, to perform plasma discharge and may be used as a gas analysis apparatus using spectral distribution or spectral intensity depending on a discharge gas. The plasma generation apparatus 100 may be mounted on an artificial satellite, or the like, to be used as a plasma thruster.

The vacuum chamber 12 may be used for various purposes. The vacuum chamber 12 may be exhausted by a vacuum pump and may provide an environment in which the plasma generation apparatus 100 generates plasma.

The plasma generation unit 120 has a spherical or elliptical cavity 122 and a plasma extraction hole 124, formed to communicate an external space with the cavity 122, and receives the RF power supply 174 to generate plasma in the cavity 122. The plasma generation unit 120 may be formed of a conductive material. The plasma generation unit 120 may have a cylindrical shape. The cavity 122 may be, in detail, a spherical cavity, but may be an elliptical cavity. The cavity 122 may have a diameter of several millimeters to several centimeters. The plasma extraction hole 124 may communicate with the cavity 122 and may extract plasma, generated in the cavity, outwardly of the cavity 122. A diameter of the plasma extraction hole 124 may be half to one-tenth of the diameter of the cavity 122. The diameter of the cavity 122 may be smaller than an average free path. A gas pressure in the cavity may be several mTorr (in detail, 1 mTorr) or less. Accordingly, electrons in the cavity 122 may perform bounce resonance without colliding with neutral particles.

The plasma generation unit 120 may be in the form of a cylinder having one end provided with the plasma extraction hole 124. The plasma generation unit 120 may include a left plasma generation unit 120a, having a left hemispherical cavity provided with the plasma extraction hole 124, and a right plasma generation unit 120b having a right hemispherical cavity aligned with the left hemispherical cavity. Accordingly, the left plasma generation unit 120a and the right plasma generation unit 120b may be coupled to each other to provide the spherical cavity 122.

The parasitic discharge prevention unit 110 is disposed to cover the plasma generation unit 120 to prevent generation of parasitic plasma. The parasitic discharge prevention unit 110 has an auxiliary hole 112, aligned with the plasma extraction hole 124, and is formed of an insulating material. The parasitic discharge prevention unit 110 may have a cylindrical shape and may have a thickness of several millimeters to prevent parasitic discharge from occurring. The parasitic discharge prevention unit 110 may be formed of an insulating material such as alumina or a ceramic material. The auxiliary of the parasitic discharge prevention unit 110 may have a diameter greater than or equal to the diameter of the plasma extraction hole 124. The auxiliary hole 112 and the plasma extraction hole 124 may be aligned with each other to provide a path through which plasma is extracted. The parasitic discharge prevention unit 120 may be in the form of a cylinder with one end, having a center provided with the auxiliary hole 112, and the other end opened.

An auxiliary insulating portion 130 may have one end, disposed in contact with the other end of the plasma generation unit 120, and may have a cylindrical shape. A material of the auxiliary insulating portion 130 may be alumina or ceramic. The auxiliary insulating portion 130 may have a center provided with a through-hole. The auxiliary insulating portion 130 may suppress parasitic discharge and may provide a path through which the RF power supply 174 is supplied.

A power supply rod 132 may be disposed to penetrate through the center of the auxiliary insulating layer 130 and may be in electric contact with the other end of the plasma generation unit 120. The power supply rod 132 may be screw-coupled to the other end of the plasma generation unit 120. A material of the power supply rod 132 may be a high electrical conductivity material such as copper (Cu).

A guide pipe 140 is disposed to cover a coaxial cable 141 and may support the auxiliary insulating portion 130. The guide pipe 140 may be a conductor, for example, an iron alloy such as stainless steel. The guide pipe 140 may have one end connected to the other end of the auxiliary insulating portion 130 and may be formed of a conductive material. The guide pipe 140 may be in the form of a cylinder extending in an extension direction of the auxiliary insulating portion 130. The pipe guide 140 may provide functions of a feed-through for supply of power.

The coaxial cable 141 may be disposed inside the guide pipe 140 and may supply power to the power supply rod 132. The coaxial cable 141 may include an internal conducting wire 142 and an external conducting wire 144 electrically insulated from the internal the internal conducting wire 142. The external conducting wire 141 may be grounded. The coaxial cable 141 may be electrically connected to the RF power supply 174 while significantly reducing impedance change or leakage power of the plasma generation unit 120.

A flange 154 may be coupled to the port 154 of the vacuum chamber 14 and may perform vacuum sealing. The flange 154 may be disposed to cover the other end of the guide pipe 140. The flange 154 may have a locking portion 146 to prevent the flange 154 from being sucked into the vacuum chamber 14 by vacuum suction force. A diameter of the guide pipe 140 on the locking portion 146 may be greater than a diameter of the guide pipe 140 on the other portions. An O-ring may be inserted into the locking portion 146 of the flange 154 to perform vacuum sealing.

A cylindrical spacer 162 may be inserted to the locking portion 146 on which the guide pipe 140 has a greatest diameter. The O-ring, having an internal side on which the spacer 162 is inserted, may be pressed to maintain vacuum sealing. A screw thread may be formed on an external circumferential surface of the locking portion 146 on which the guide pipe 140 has a greatest diameter.

A power cable connection portion 164 may include an electrical connector 166 coupled to the other end of the guide pipe 140 and configured to supply power to the coaxial cable 141. The electrical connector 166 may be a Bayonet Neill-Concelman (BNC) connector. The power cable connection portion 164 may be in the form of a cylinder having one end opened and may have one surface provided with a step. A screw groove may be formed around the step and may be coupled to the screw thread, formed on the external circumferential surface of the locking portion 146 on which the guide pipe 140 has a greatest diameter, to press the spacer 162.

The RF power supply 174 may supply RF power having a driving frequency, corresponding to a bounce resonance frequency given by temperature of electrons in the cavity 122 and the diameter of the cavity 122, to the plasma generation unit 120. The RF power supply 174 may be a variable frequency power supply. The RF power 174 may have a driving frequency of sever megahertz (MHz) to hundreds of MHz, and the driving frequency may be varied to match the bound resonance frequency. The RF power 174 may supply power to the plasma generation unit 120 through an impedance matching network 172.

Figure 3:
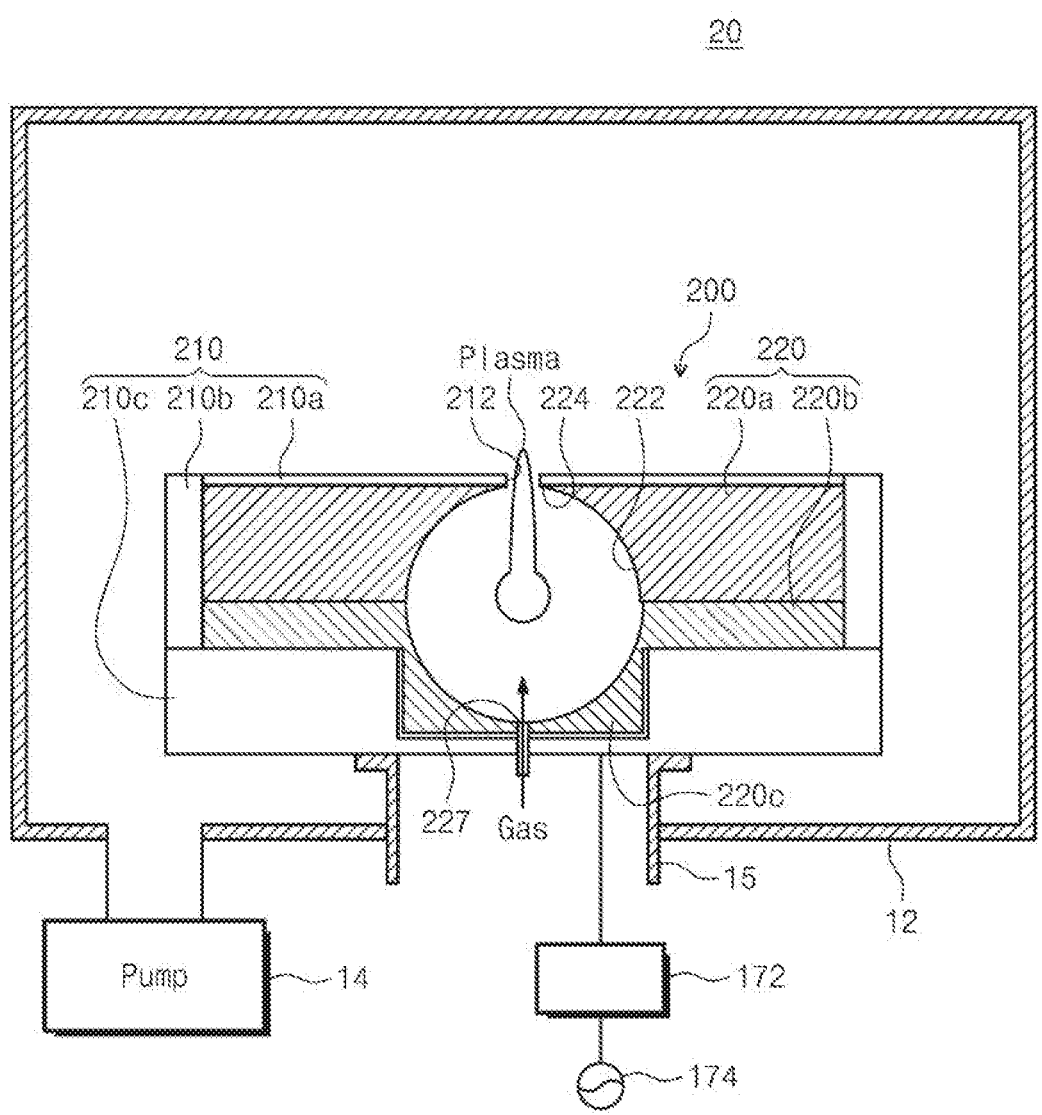
FIG. 3 illustrates a plasma system in which a plasma generation apparatus according to another example embodiment of the present disclosure is mounted.

FIG. 3 illustrates a plasma system in which a plasma generation apparatus according to another example embodiment of the present disclosure is mounted.

Referring to FIG. 3, a plasma system 20 may include a vacuum chamber 12, a vacuum pump 14, and a plasma generation apparatus 200. The plasma generation apparatus 200 may include a plasma generation unit 220, a parasitic discharge prevention unit 210, and a radio-frequency (RF) power supply 174.

The plasma generation apparatus 200 includes a plasma generation unit 220 having a spherical or elliptical cavity 222 and a plasma extraction hole 224, formed to communicate an external space with the cavity 222, receiving radio-frequency (RF) power to generate plasma in the cavity 222, and formed of a conductive material, a parasitic discharge prevention unit 210 disposed to cover the plasma generation unit 220 to prevent generation of parasitic plasma, having an auxiliary hole 212 aligned with the plasma extraction hole 224, and formed of an insulating material, and an RF power supply 174 configured to supply RF power having a driving frequency, corresponding to a bounce resonance frequency given by temperature of electrons in the cavity 222 and a diameter of the cavity 222, to the plasma generation unit 220.

The plasma generation unit 220 may include an upper plasma generation unit 220a having the plasma extraction hole 224 and an upper hemispherical cavity, and a lower plasma generation unit 220b having a gas supply hole 227, formed in a position facing the plasma extraction hole 224, and a lower hemispherical cavity aligned with the upper hemispherical cavity. The upper plasma generation unit 220a may be in the form of a disc or a rectangular plate, and the lower plasma generation unit 220b may be in the form of a disc or a rectangular plate aligned with the upper plasma generation unit 220a. The lower plasma generation unit 220b may include a protrusion 220c protruding downwardly from a portion in which the cavity 222 is formed. Accordingly, the cavity 220 may be formed while overall reducing a thickness of the plasma generation portion 220.

The parasitic discharge prevention unit 210 may have an auxiliary hole 212 and may be disposed to fully cover the plasma generation unit 220. The auxiliary hole 212 may be aligned with the plasma extraction hole 224, and plasma jets outwardly of the cavity 222 through the plasma extraction hole 224 and the auxiliary hole 212. The gas supply hole 227 may be disposed in a position facing the plasma extraction hole 224. A gas may be supplied through the gas supply hole 227, and the supplied gas may be ionized. The gas may vary depending on a required process. For example, the gas may be a hydrogen gas or an oxygen gas.

The parasitic discharge prevention portion 210 may include a cylindrical side parasitic discharge prevention unit 210b, an upper parasitic discharge prevention unit 210a covering one surface of the side parasitic discharge prevention unit 210b and one surface of the upper plasma generation unit 220a, and a lower parasitic discharge prevention unit 210c covering the other surface of the side parasitic discharge prevention unit 210b and a bottom surface of the lower plasma generation unit 220b.

The parasitic discharge prevention unit 210 and the plasma generation unit 220 may be disposed inside a vacuum chamber, may supply a gas to the gas supply hole 227 through a vacuum port 15, and may supply RF power to the lower plasma generation unit 220b. The vacuum port 15 may be formed in a bottom surface of the vacuum chamber, and may supply a gas and RF power through the vacuum port.

Figure 4:
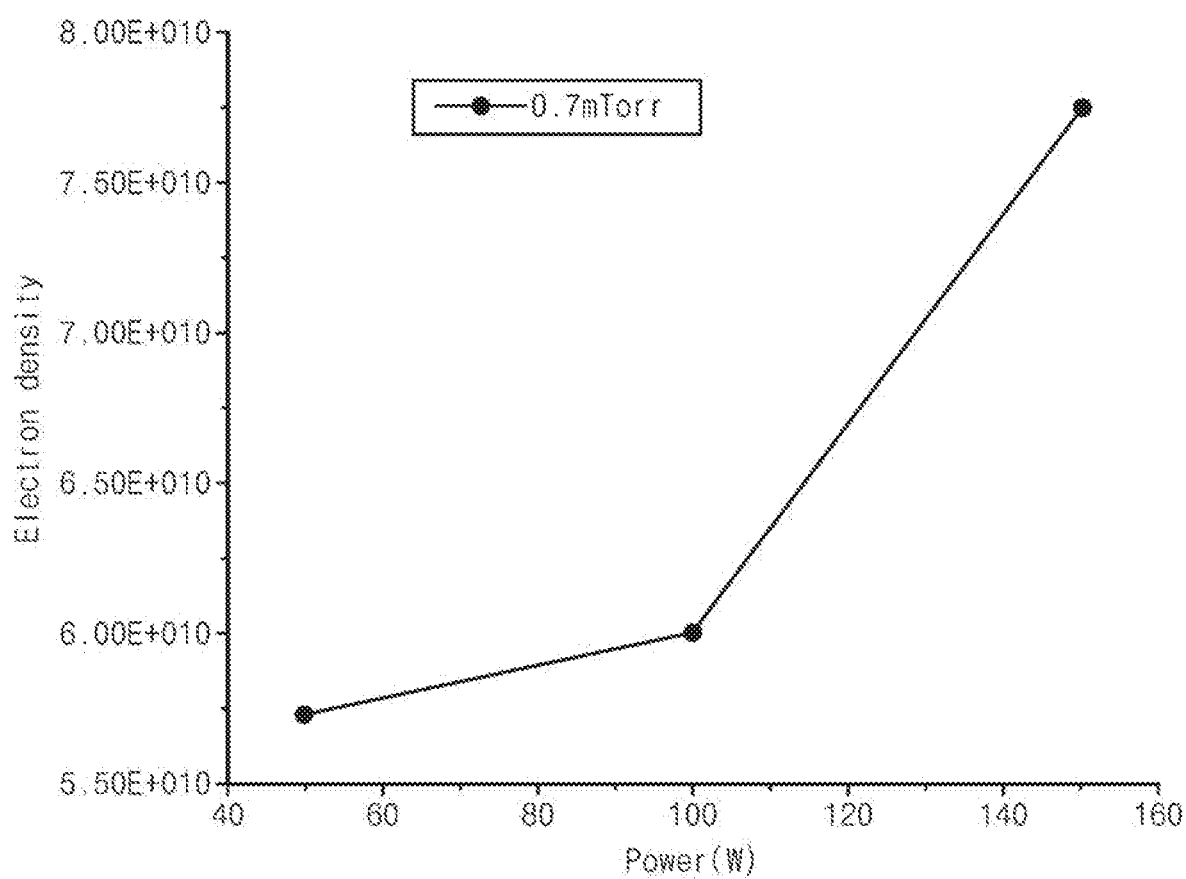
FIG. 4 is a graph illustrating a plasma density measured using the plasma system in FIG. 3.

FIG. 4 is a graph illustrating a plasma density measured using the plasma system in FIG. 3.

Referring to FIG. 4, plasma density was measured using a cutoff probe detecting a transmitted wave, transmitting plasma, while changing a frequency of a microwave and measuring a plasma cutoff frequency to measure plasma density. A pressure of a vacuum chamber was set to 0.7 mTorr, and a used gas was an argon gas. At the pressure of 0.7 mTorr, plasma density (or electron density) was $5.7 \times 10^{10}/cm^3$ at 50 watts (W) of 13.56 MHz, and was $7.7 \times 10^{10}/cm^3$ at 150 W of 13.56 MHz. In this case, a cavity had a diameter of 6.5 cm, and a plasma extraction hole had a diameter of 9 mm.

In conventional capacitively-coupled plasma, discharging cannot be performed at a pressure of 0.7 mTorr. Meanwhile, according to the present disclosure, stable discharging may be performed. When a pressure in the cavity is increased, electrons cannot satisfy bounce resonance because they collide with a neutral gas. Thus, the pressure in the cavity may be a sufficiently low pressure of several mTorr or less in such a manner that an average travel path of the neutral gas is greater than the diameter of the cavity.

According to an example embodiment, RF power, an RF driving frequency, and a diameter of a cavity may be adjusted to control a temperature of electron, plasma density, radical density and composition ratio.

Figure 5A:
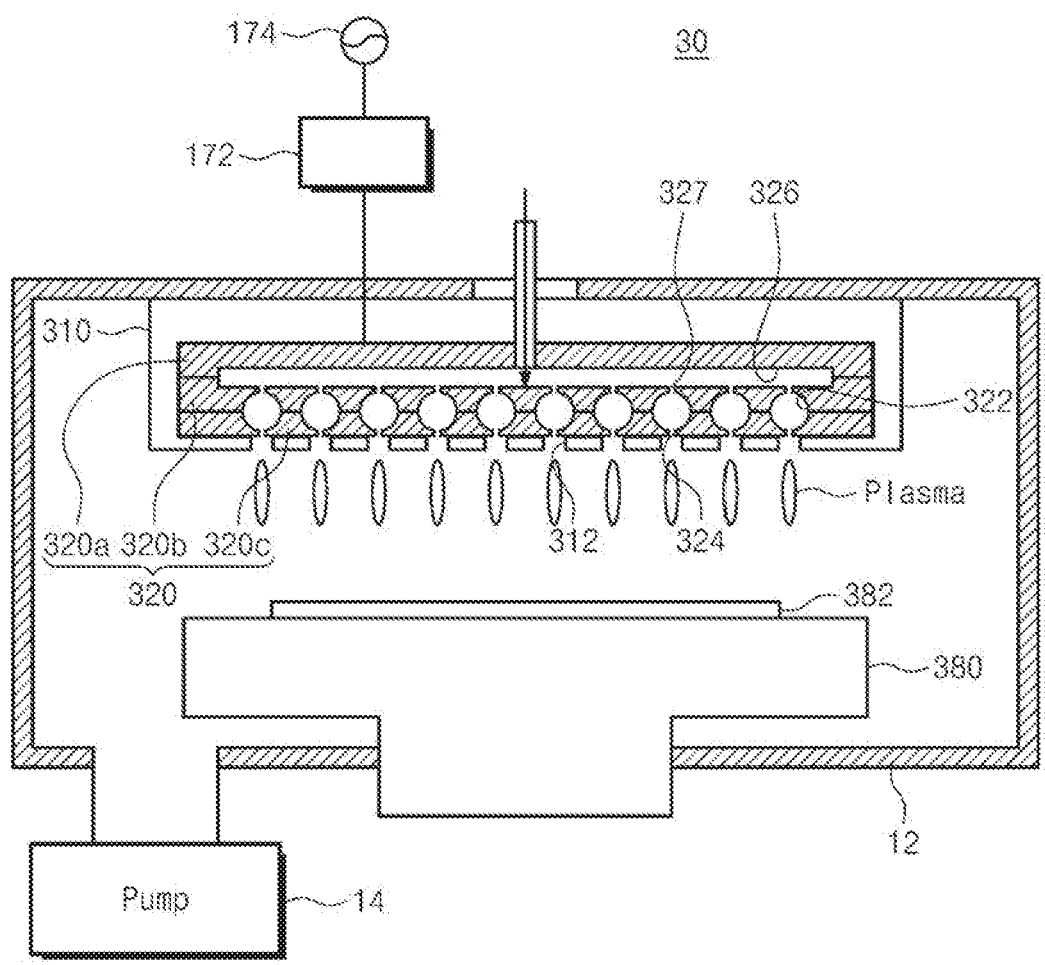
FIG. 5A illustrates a plasma processing apparatus according to another example embodiment of the present disclosure.

FIG. 5A illustrates a plasma processing apparatus according to another example embodiment of the present disclosure.

Figure 5B:
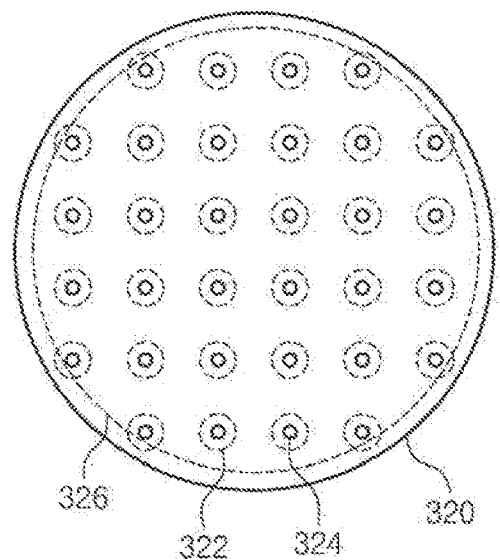
FIG. 5B is a plan view of a plasma generation unit of the plasma processing apparatus in FIG. 5A.

FIG. 5B is a plan view of a plasma generation unit of the plasma processing apparatus in FIG. 5A.

Referring to FIGS. 5A and 5B, a plasma processing apparatus 30 includes a vacuum chamber 12, a plasma generation unit 320 disposed inside the vacuum chamber 12, having a plurality of spherical or elliptical cavities 322 and plasma extraction holes 324, formed to respectively communicate an internal space of the vacuum chamber 12 with the plurality of cavities 322, receiving RF power to generate plasma in the cavities 322, and formed of a conductive material, a parasitic discharge prevention unit 310 disposed to cover the plasma generation unit 320 to prevent generation of parasitic plasma, having auxiliary holes 312 respectively aligned with the plasma extraction holes 324, and formed of an insulating material, and a radio-frequency (RF) power supply 174 configured to supply RF power, having a driving frequency corresponding to a bounce resonance frequency given by temperature of electrons in the cavity 322 and a diameter of the cavity 322, to the plasma generation unit 320.

The vacuum chamber 12 may have a cylindrical shape. The vacuum chamber 12 may be exhausted by a vacuum pump 14. The vacuum chamber 12 may be configured to perform a deposition process or an etching process.

A substrate holder 380 may face the plasma extraction hole 324 of the plasma generation unit 320 inside the vacuum chamber 12. The substrate holder 380 may be disposed at a lower portion in the vacuum chamber 14. A substrate 382 may be disposed on the substrate holder 380 to receive plasma extracted by the plasma extraction holes 324. The substrate holder 380 may have a disc shape, and the substrate 382 may be a circular substrate.

The plasma generation unit 320 may have a disc shape, and may be disposed at an upper portion in the vacuum chamber 12. The plasma generation unit 320 may have a plurality of spherical or elliptical cavities 322. The cavities 322 may be arranged in the same plane in a matrix format, or may be disposed in such a manner that density of cavities in a peripheral portion is locally high to adjust spatial uniformity. The plasma extraction holes 324 may be formed to communicate an internal space of the vacuum chamber 12 with the cavities 322, respectively. The cavities 322 may have the same shape, and the plasma extraction holes 324 may have the same diameter. The plasma generation unit 320 may receive RF power to generate plasma in the cavities 322 for bounce resonance of electrons, and may be formed of a conductive material. Each of the cavities 322 may have a spherical or elliptical shape. The plasma generation unit 320 may have gas supply holes 327 formed in positions facing the plasma extraction holes 324, respectively. The gas extraction holes 327 may provide a gas to the cavities 322, respectively. The plasma, generated in the cavities 322, may jet through the plasma extraction holes 324. A gas distribution space 326, communicating with the gas supply holes 327, may be provided to distribute a gas to the cavities 322. The gas distribution space 326 may allow a gas to be uniformly distributed to all the gas supply holes 327. Each of the gas supply holes 327 may have a diameter smaller than a diameter of each of the plasma extraction holes 327 to prevent plasma from jetting. The gas distribution space 326 may be set not to satisfy a bounce resonance condition of electrons. For example, a height of the gas distribution space 326 may be set to be smaller than a diameter of each of the cavities 322. The gas distribution space 326 may receive a gas from outside of the vacuum chamber 12. The plasma generation unit 320 may receive RF power from the RF power supply 174 disposed outside of the vacuum chamber 12.

The gas distribution space 326 may be in the form of a disc embedded in the plasma generation unit 320. The plasma extraction holes 324 may be periodically arranged at regular intervals on the same plane. The plasma generation unit 320 may include an upper plasma generation unit 320a having a disc shape, a middle plasma generation unit 320b having a disc shape, and a lower plasma generation unit 320c having a disc shape. The upper plasma generation unit 320a, the middle plasma generation unit 320b, and the lower plasma generation unit 320c may be stacked structures aligned with each other. A recessed portion, disposed on a bottom surface of the upper plasma generation unit 320a, and a recessed portion, disposed on a top surface of the middle plasma generation unit 320b, may be coupled to each other to provide the gas distribution space 326. A plurality of hemispherical cavities, formed in a bottom surface of the middle plasma generation unit 320b, and a plurality of hemispherical cavities, formed in a top surface of the lower plasma generation unit 320c, may be coupled to each other to provide spherical cavities 322.

The parasitic discharge prevention unit 310 may be disposed to cover the plasma generation unit 320, and may have auxiliary holes 312 to expose the plasma extraction holes 324. Each of the auxiliary holes 312 may have a diameter greater than a diameter of each of the plasma extraction holes 324. Each of the auxiliary holes 312 may have a cylindrical or truncated conical shape.

Figure 6:
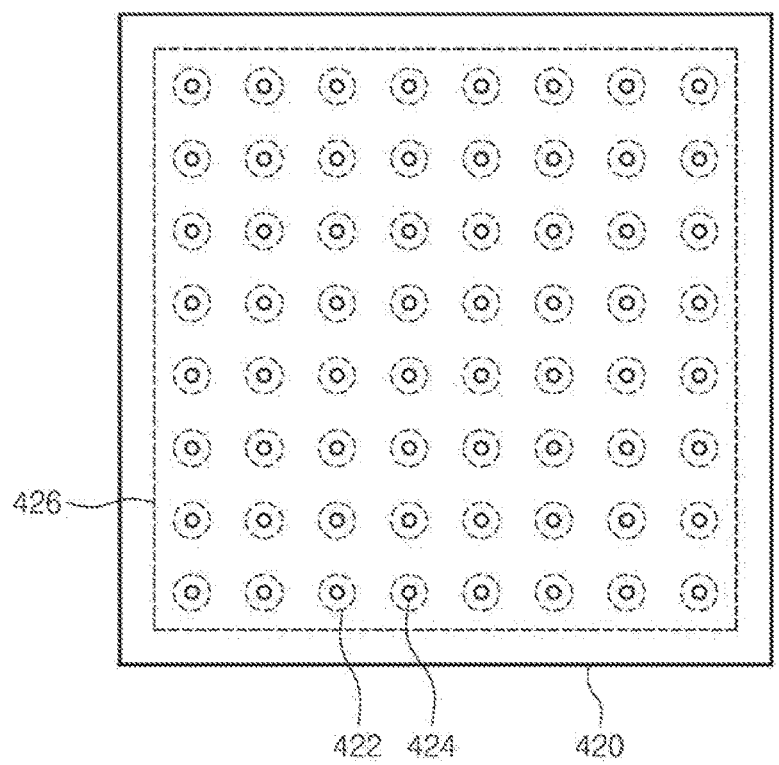
FIG. 6 is a plan view of a plasma generation unit according to another example embodiment of the present disclosure.

FIG. 6 is a plan view of a plasma generation unit according to another example embodiment of the present disclosure.

Referring to FIGS. 5A and 6, a plasma generation unit 420 may be in the form of a rectangular plate and may be disposed an upper portion in a vacuum chamber. The plasma generation unit 420 may have a plurality of spherical or elliptical cavities 422. The cavities 422 may be arranged in a matrix format, or may be disposed in such a manner that density of cavities in a peripheral portion is high to adjust spatial uniformity. The plasma extraction holes 424 may be formed to communicate an internal space of a vacuum chamber with the cavities 422, respectively. The cavities 422 may have the same shape, and the plasma extraction holes 424 may have the same diameter. The plasma generation unit 420 may receive RF power to generate plasma in the cavities 422 for bounce resonance of electrons, and may be formed of a conductive material. Each of the cavities 422 may have a spherical or elliptical shape. The plasma generation unit 420 may have gas supply holes respectively formed in positions facing the plasma extraction holes 424. The gas supply holes may supply a gas to the cavities 422, respectively. Plasma, generated in the cavities 422, may jet through the plasma extraction holes 424. A gas distribution space 426, communicating with the gas supply holes, may be provided to distribute a gas to the cavities 422. The gas distribution space 426 may allow a gas to uniformly distribute to all the gas supply holes. The gas distribution space may be set not to satisfy a bounce resonance condition of electrons. For example, a height of the gas distribution space 426 may be set to be smaller than a diameter of each of the cavities 422. The gas distribution space 426 may receive a gas from outside of the vacuum chamber. The plasma generation unit 420 may receive RF power from an RF power supply disposed outside of the vacuum chamber.

Figure 7:
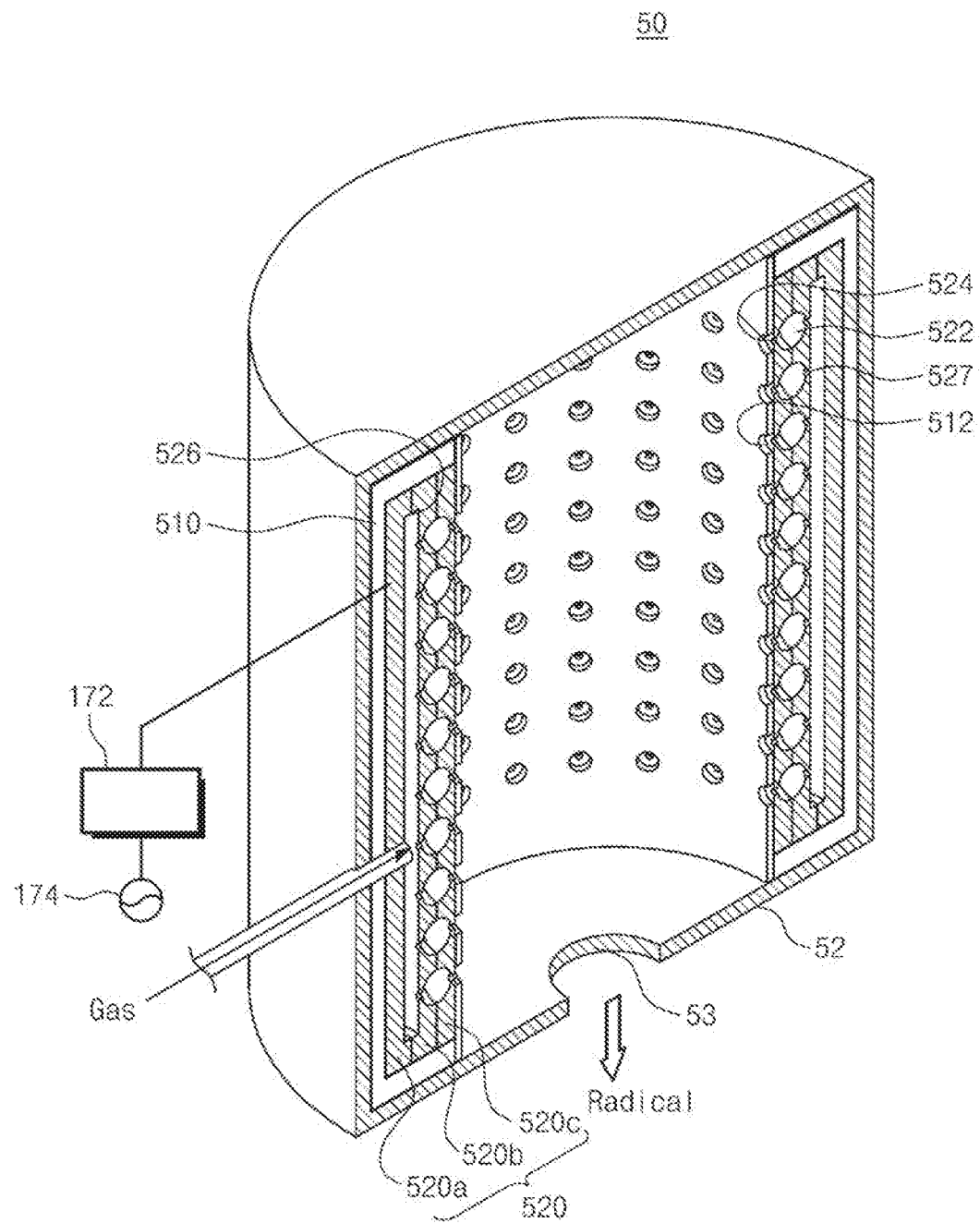
FIG. 7 is a cutaway perspective view of plasma generation unit according to another example embodiment of the present disclosure.

FIG. 7 is a cutaway perspective view of plasma generation unit according to another example embodiment of the present disclosure.

Referring to FIG. 7, a plasma processing apparatus 50 may receive a gas to generate radicals and provide the radicals to an additional process chamber. The plasma processing apparatus 50 may operate as a remote plasma source.

The plasma processing apparatus 30 includes a vacuum chamber 52, a plasma generation unit 520 disposed inside the vacuum chamber 52, having a plurality of spherical or elliptical cavities 522 and plasma extraction holes 524, formed to respectively communicate an internal space of the vacuum chamber 52 with the plurality of cavities 522, receiving RF power to generate plasma in the cavities 522, and formed of a conductive material, a parasitic discharge prevention unit 510 disposed to cover the plasma generation unit 520 to prevent generation of parasitic plasma, having auxiliary holes 512 respectively aligned with the plasma extraction holes 524, and formed of an insulating material, and a radio-frequency (RF) power supply 174 configured to supply RF power, having a driving frequency corresponding to a bounce resonance frequency given by temperature of electrons in the cavity 522 and a diameter of the cavity 522, to the plasma generation unit 520.

The vacuum chamber 52 may have a cylindrical shape. The vacuum chamber 52 may have a bottom surface provided with a port for extracting radicals.

The plasma generation unit 520 may include an outer plasma generation unit 520a having a cylindrical shape, an intermediate plasma generation unit 520b having a cylindrical shape, and an inner plasma generation unit 520c having a cylindrical shape. The outer plasma generation unit 520a, the intermediate plasma generation unit 520b, and the inner plasma generation unit 520c may be coaxial structures aligned with each other. Hemispherical cavities, formed on an inner side of the intermediate plasma generation unit 520b, and hemispherical cavities, formed on an outer side of the inner plasma generation unit 520c, may be coupled to each other to provide spherical cavities 522.

The plasma generation unit 520 may have gas supply holes 527, formed in positions facing the plasma extraction hole 524 from the cavity 522, and a gas distribution space 526 communicating with the gas supply holes 527. The plasma generation unit 520 may have a cylindrical shape and may be disposed adjacent to an inner side surface of the vacuum chamber 52. The gas distribution space 526 may be in the form of a cylinder embedded in the plasma generation unit 520. The plasma extraction holes 522 of the plasma generation unit 526 may be arranged to face a central axis of the plasma generation unit 526. The plasma extraction holes 522 may be spaced apart from each other and periodically arranged at regular intervals in an azimuthal direction and a central axis direction. The gas distribution space 526 may receive a gas from outside of the vacuum chamber 52 and may supply the gas to the cavities 522 through the gas supply holes 527.

The parasitic discharge prevention unit 510 may have a rectangular cross section and may be in the form of a hollow toroid. The plasma generation unit 520, having a cylindrical or rectangular cross section, may be disposed in the parasitic discharge prevention unit 510. Accordingly, the cylindrical plasma generation unit 520 may provide radicals in the central axis direction thereof. Auxiliary holes 512 may be formed on an inner side surface of the parasitic discharge prevention unit 510 and may be aligned with the plasma extraction holes 524. The parasitic discharge prevention unit 510 may be disposed in a coaxial structure to be in close contact with the vacuum chamber 52.

Figure 8:
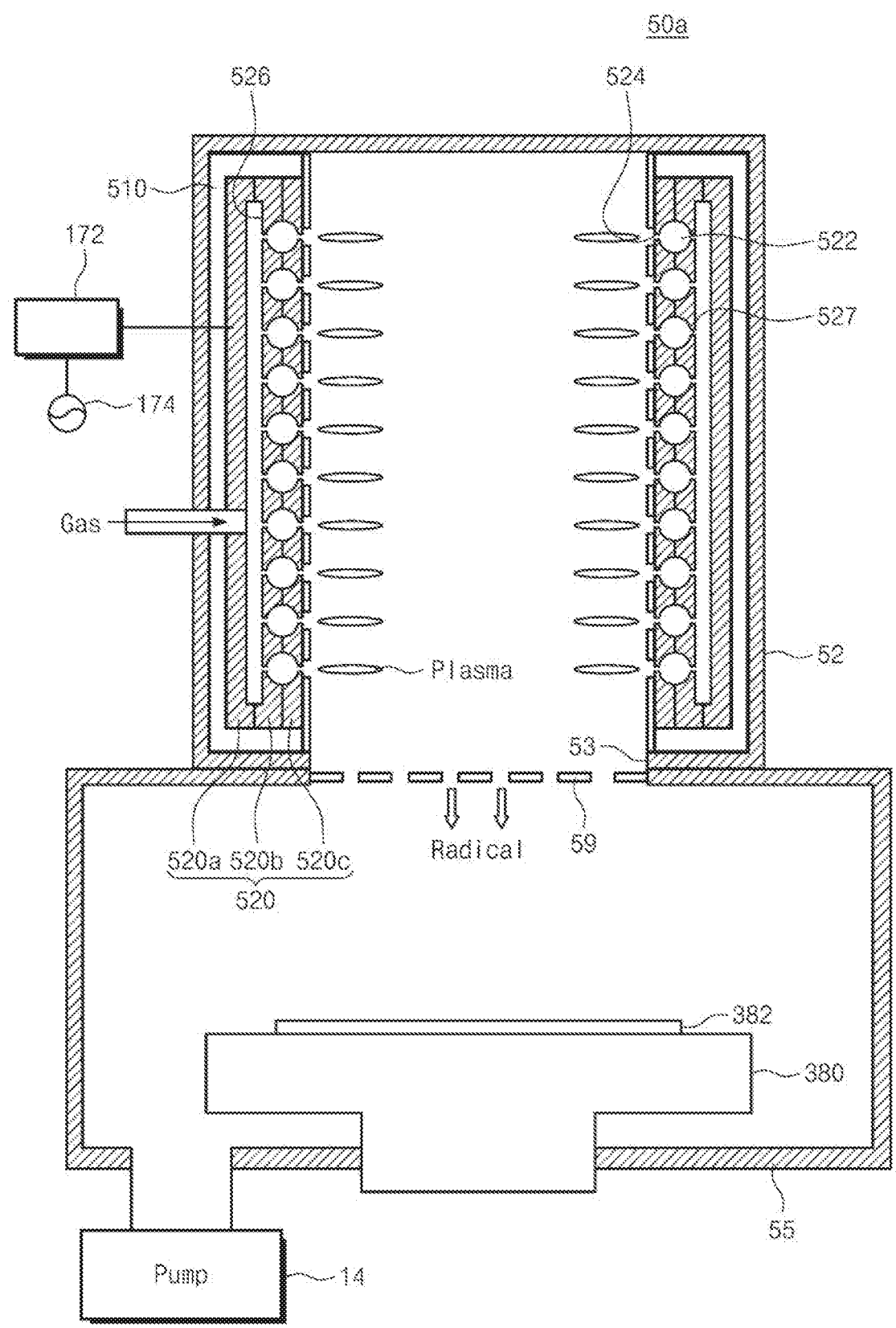
FIG. 8 illustrates a plasma processing apparatus according to another example embodiment of the present disclosure.

FIG. 8 illustrates a plasma processing apparatus according to another example embodiment of the present disclosure.

Referring to FIG. 8, a plasma processing apparatus 50a includes a vacuum chamber 52, a plasma generation unit 520 disposed inside the vacuum chamber 52, having a plurality of spherical or elliptical cavities 522 and plasma extraction holes 524, formed to respectively communicate an internal space of the vacuum chamber 52 with the plurality of cavities 522, receiving RF power to generate plasma in the cavities 522, and formed of a conductive material, a parasitic discharge prevention unit 510 disposed to cover the plasma generation unit 520 to prevent generation of parasitic plasma, having auxiliary holes 512 respectively aligned with the plasma extraction holes 524, and formed of an insulating material, and a radio-frequency (RF) power supply 174 configured to supply RF power, having a driving frequency corresponding to a bounce resonance frequency given by temperature of electrons in the cavity 522 and a diameter of the cavity 522, to the plasma generation unit 520.

The vacuum chamber 52 may have a cylindrical shape. The vacuum chamber 52 may have a bottom surface provided with a port 53 for extracting radicals.

The plasma generation unit 520 may include an outer plasma generation unit 520a having a cylindrical shape, an intermediate plasma generation unit 520b having a cylindrical shape, and an inner plasma generation unit 520c having a cylindrical shape. The outer plasma generation unit 520a, the intermediate plasma generation unit 520b, and the inner plasma generation unit 520c may be coaxial structures aligned with each other. A recessed portion, formed on an inner side surface of the outer plasma generation unit 520a, and a recessed region, formed on an outer side surface of the intermediate plasma generation unit 520b, may be coupled to each other to provide a gas distribution space. Hemispherical cavities, formed on an inner side of the intermediate plasma generation unit 520b, and hemispherical cavities, formed on an outer side of the inner plasma generation unit 520c, may be coupled to each other to provide spherical cavities 522.

The plasma generation unit 520 may have gas supply holes 527, formed in positions facing the plasma extraction hole 524 from the cavity 522, and a gas distribution space 526 communicating with the gas supply holes 527. The plasma generation unit 520 may have a cylindrical shape and may be disposed adjacent to an inner side surface of the vacuum chamber 52. The gas distribution space 526 may be in the form of a cylinder embedded in the plasma generation unit 520. The plasma extraction holes 522 of the plasma generation unit 526 may be arranged to face a central axis of the plasma generation unit 526. The plasma extraction holes 522 may be spaced apart from each other and periodically arranged at regular intervals in an azimuthal direction and a central axis direction. The gas distribution space 526 may receive a gas from outside of the vacuum chamber 52 and may supply the gas to the cavities 522 through the gas supply holes 527.

The parasitic discharge prevention unit 510 may have a rectangular cross section and may be in the form of a hollow toroid. The plasma generation unit 520, having a cylindrical or rectangular cross section, may be disposed in the parasitic discharge prevention unit 510. Accordingly, the cylindrical plasma generation unit 520 may provide radicals in the central axis direction thereof. Auxiliary holes 512 may be formed on an inner side surface of the parasitic discharge prevention unit 510 and may be aligned with the plasma extraction holes 524. The parasitic discharge prevention unit 510 may be disposed in a coaxial structure to be in close contact with the vacuum chamber 52.

A process chamber 555 may have a cylindrical shape and may be connected to an opened end of the vacuum chamber 52 to receive radicals generated in the vacuum chamber 52. A baffle 59 may be disposed between the opened end of the vacuum chamber 52 and the process chamber 52. The baffle 59 may spatially and uniformly distribute the radicals generated in the vacuum chamber 52.

A substrate holder 380 may be disposed in the process chamber 52 and may receive radicals generated by the plasma generation unit 520. The substrate holder 380 may be disposed on a lower portion of the process chamber 55.

A substrate 382 may be disposed on the substrate holder 380 to receive the radicals. The substrate holder 380 may have a disc shape.

As described above, a plasma generation apparatus according to example embodiments may vary plasma characteristics depending on a spherical cavity, a structure and a size of a hole connected to the cavity, and a change in external power. Thus, the plasma generation apparatus may be applied to UV (or EUV), a plasma thruster, plasma for semiconductor/display, and the like.

Although the present disclosure and its advantages have been described in detail, it should be understood that various changes, substitutions and alterations can be made herein without departing from the spirit and scope of the disclosure as defined by the following

What is claimed is:

1. A plasma generation apparatus comprising a plasma generation unit, a vacuum chamber, a parasitic discharge prevention unit, a radio-frequency (RF) power supply and a power supply rod,
   wherein the plasma generation unit has a spherical or elliptical cavity,
   the plasma generation unit is made of a conductive material and receives radio-frequency (RF) power from the power supply rod in such a manner that bounce resonance of electrons is performed to generate plasma in the cavity,
   the cavity has a plasma extraction hole to communicate with an internal space of the vacuum chamber,
   the radio-frequency (RF) power supply is configured to supply RF power having a driving frequency corresponding to a bounce resonance frequency given by a temperature of electrons in the cavity and a diameter of the cavity to the plasma generation unit,
   the parasitic discharge prevention unit covers the plasma generation unit to prevent generation of parasitic plasma, has an auxiliary hole respectively aligned with the plasma extraction hole, and comprises an insulating material; and
   the plasma generation unit is inside the vacuum chamber.

2. The plasma generation apparatus as set forth in claim 1, wherein the RF power supply is a variable frequency power supply or a power supply having a plurality of driving frequencies.

3. The plasma generation apparatus as set forth in claim 1, wherein the plasma generation unit includes a left plasma generation unit, having a left hemispherical cavity having the plasma extraction hole, and a right plasma generation unit having a right hemispherical cavity aligned with the left hemispherical cavity,
   the parasitic discharge prevention unit has a cylindrical shape,
   the parasitic discharge prevention unit has one end with an auxiliary hole in a center thereof,
   the parasitic discharge prevent unit has another end that is open, and
   the plasma generation apparatus further comprising:
   a cylindrical auxiliary insulating portion having one end in contact with an end of the plasma generation unit.

4. The plasma generation apparatus as set forth in claim 1, wherein the plasma generation unit has a plurality of spherical or elliptical cavities and plasma extraction holes that respectively communicate an internal space of the vacuum chamber with the cavities, and receives the RF power to generate plasma in the cavities.

5. The plasma generation apparatus as set forth in claim 4, wherein the plasma generation unit comprises:
   gas supply holes respectively facing the plasma extraction holes; and a gas distribution space communicating with the gas supply holes.

6. The plasma generation apparatus as set forth in claim 4, wherein the plasma extraction holes are spaced apart from each other and are periodically arranged at regular intervals in an azimuthal direction and a central axis direction.

7. The plasma generation apparatus as set forth in claim 4, further comprising:
a cylindrical process chamber connected to an open end of the process chamber;
a substrate holder configured to receive radicals generated by the plasma generation unit in the process chamber; and
a substrate on the substrate holder to receive the radicals, wherein the substrate holder has a disc shape.

8. A plasma generation apparatus, comprising:
a power supply rod;
a plasma generation unit having a spherical or elliptical cavity and a plasma extraction hole to communicate an external space with the cavity, receiving radio-frequency (RF) power from the power supply rod to generate plasma in the cavity, and formed of a conductive material;
a parasitic discharge prevention unit covering the plasma generation unit to prevent generation of parasitic plasma, having an auxiliary hole aligned with the plasma extraction hole, and comprising an insulating material; and
an RF power supply configured to supply the RF power having a driving frequency, corresponding to a bounce resonance frequency given by a temperature of electrons in the cavity and a diameter of the cavity, to the plasma generation unit,
wherein the plasma generation unit is in the form of a cylinder having one end provided with the plasma extraction hole,
the plasma generation unit includes a left plasma generation unit, having a left hemispherical cavity having the plasma extraction hole, and a right plasma generation unit having a right hemispherical cavity aligned with the left hemispherical cavity,
the parasitic discharge prevention unit has a cylindrical shape,
the parasitic discharge prevention unit has one end provided with an auxiliary hole in a center thereof,
the parasitic discharge prevention unit has another end that is open,
the plasma generation apparatus further comprising:
a cylindrical auxiliary insulating portion having one end in contact with an end of the plasma generation unit;
a power supply rod penetrating through a center of the auxiliary insulating portion, being in electrical contact with the other end of the plasma generation unit;
a cylindrical guide pipe having one end coupled to another end of the auxiliary insulating portion, comprising a conductive material, and extending in an extension direction of the auxiliary insulating portion;
a coaxial cable, in the guide pipe, supplying power to the power supply rod;
a flange in another end of the guide pipe, covering the other end of the guide pipe, and coupled to a port of a vacuum chamber; and
a power cable connection portion, coupled to the other end of the guide pipe, including an electrical connector supplying power to the coaxial cable.

9. A plasma generation apparatus comprising:
a power supply rod;
a plasma generation unit having a spherical or elliptical cavity and a plasma extraction hole to communicate an external space with the cavity, receiving radio-frequency (RF) power from the power supply rod to generate plasma in the cavity, and formed of a conductive material;
a parasitic discharge prevention unit covering the plasma generation unit to prevent generation of parasitic plasma, having an auxiliary hole aligned with the plasma extraction hole, and comprising an insulating material; and
an RF power supply configured to supply the RF power having a driving frequency, corresponding to a bounce resonance frequency given by a temperature of electrons in the cavity and a diameter of the cavity, to the plasma generation unit,
wherein the plasma generation unit comprises:
an upper plasma generation unit having the plasma extraction hole and an upper hemispherical cavity; and
a lower plasma generation unit having a gas supply hole in a position facing the plasma extraction hole, and a lower hemispherical cavity aligned with the upper hemispherical cavity,
wherein the parasitic discharge prevention unit has an auxiliary hole and fully covers the plasma generation unit,
the parasitic discharge prevention unit and the plasma generation unit are inside a vacuum chamber,
a gas is supplied to the gas supply hole through a vacuum port mounted at the vacuum chamber, and
the lower plasma generation unit receives RF power through the vacuum port mounted at the vacuum chamber.

10. A plasma processing apparatus comprising:
a vacuum chamber;
a plasma generation unit inside the vacuum chamber, having a plurality of spherical or elliptical cavities and plasma extraction holes, formed to respectively communicate an internal space of the vacuum chamber with the plurality of cavities, receiving RF power to generate plasma in the cavities, and formed of a conductive material;
a parasitic discharge prevention unit covering the plasma generation unit to prevent generation of parasitic plasma, having auxiliary holes respectively aligned with the plasma extraction holes, and formed of an insulating material; and
a radio-frequency (RF) power supply configured to supply RF power having a driving frequency corresponding to a bounce resonance frequency given by a temperature of electrons in the cavity and a diameter of the cavity to the plasma generation unit.

11. The plasma processing apparatus as set forth in claim 10, wherein the plasma generation unit comprises:
gas supply holes respectively facing the plasma extraction holes from the cavities; and
a gas distribution space communicating with the gas supply holes.

12. The plasma processing apparatus as set forth in claim 11, wherein the vacuum chamber has a cylindrical shape,
the plasma generation unit has a disc shape and is on an internal upper portion of the vacuum chamber, the plasma processing apparatus further comprising:
a substrate holder facing the plasma extraction holes of the plasma generation unit in the vacuum chamber; and
a substrate on the substrate holder to receive plasma extracted by the plasma extraction holes, and
the substrate holder has a disc shape.

13. The plasma processing apparatus as set forth in claim 11, wherein the vacuum chamber has a rectangular box shape,
the plasma generation unit has a rectangular plate shape and is on an internal upper portion of the vacuum chamber,
the plasma processing apparatus further comprising:
a substrate holder facing the plasma extraction holes of the plasma generation unit in the vacuum chamber; and
a substrate on the substrate holder to receive plasma extracted by the plasma extraction holes, and
the substrate holder has a rectangular pillar shape.

14. The plasma processing apparatus as set forth in claim 11, wherein the vacuum chamber has a cylindrical shape, the plasma generation unit has a cylindrical shape and is on an internal side surface of the vacuum chamber,
the gas distribution space is in the form of a cylinder embedded in the plasma generation unit,
the plasma extraction holes of the plasma generation unit are arranged to face a central axis of the plasma generation unit, and
the plasma extraction holes are spaced apart from each other and are periodically arranged at regular intervals in an azimuthal direction and a central axis direction.

15. The plasma processing apparatus as set forth in claim 14, further comprising:
a cylindrical process chamber connected to an open end of the vacuum chamber;
a substrate holder to receive radicals generated by the plasma generation unit in the process chamber; and
a substrate on the substrate holder to receive the radicals, wherein the substrate holder has a disc shape.

* * * * *